United States Patent [19]

Hopkins et al.

[11] Patent Number: 5,071,660
[45] Date of Patent: Dec. 10, 1991

[54] PROCESS UTILIZING ALCOHOL OXIDASE

[75] Inventors: Thomas R. Hopkins, Bartlesville; Vickie J. Smith, Tulsa, both of Okla.; Dennis S. Banasiak, Fresno, Calif.

[73] Assignee: Phillips Petroleum Company, Bartlesville, Okla.

[21] Appl. No.: 581,222

[22] Filed: Sep. 11, 1990

Related U.S. Application Data

[63] Continuation of Ser. No. 208,329, Jun. 10, 1988, Pat. No. 4,954,354.

[51] Int. Cl.$^5$ ............ A23B 1/10; C12G 1/00; A23L 1/00; B65D 81/28
[52] U.S. Cl. ............................. 426/8; 426/7; 426/12; 435/171; 435/262; 435/266; 435/810
[58] Field of Search ............. 426/7, 8, 12; 435/171, 435/262, 266, 810

[56] References Cited

U.S. PATENT DOCUMENTS 4,414,334 11/1983 Hirzman ............................. 435/262
4,510,162 4/1985 Nezat ................................. 426/124
4,551,431 11/1985 Pierce ................................ 435/176

FOREIGN PATENT DOCUMENTS 0126941 12/1984 European Pat. Off. .

OTHER PUBLICATIONS

Derwent Abs 86-194605 (J61128867) Dainippon Inc. (1986).
Derwent Abs 80-08057c (J54157866) Toyolnk Mfg (1979).

Primary Examiner—Herbert J. Lilling
Attorney, Agent, or Firm—Woodrow Hal Brent

[57] ABSTRACT

Novel packaging in a process for producing same is disclosed whereby oxygen from the interior of an enclosed container is scavenged by introducing into the container the enzyme, alcohol oxidase and its substrate, alcohol.

6 Claims, No Drawings

PROCESS UTILIZING ALCOHOL OXIDASE

This application is a division of application Ser. No. 208,329, filed June 10, 1988, now U.S. Pat. No. 4,954,354.

FIELD OF INVENTION

The present invention pertains to a method for removing oxygen from the atmosphere of an enclosed container. Another aspect of the invention pertains to articles of manufacture possessing an oxygen free environment.

It is well known within the food packaging industry that the presence of oxygen within packaged foods leads to their premature spoilage. Thus, there has been a search for an effective means to scavenge oxygen from packaged foods, but none of the solutions to date have been totally satisfactory.

One of the first solutions was to flush the contents of a package with an inert gas, but this technique has not been completely successful. For example, the potato chip industry uses this technique to extend the shelf life of their products from 2 months to 6 months. But, if all of the residual oxygen were removed from the package, it should be possible to extend its shelf life to 2 years.

Attempts have been made to remove this residual oxygen but none have been entirely adequate for dry food products.

For example, U.S. Pat. No. 3,016,336 discloses a method which uses the enzyme, glucose oxidase, to scavenge oxygen. In order for this method to be effective, it is necessary that the enzyme, glucose oxidase, as well as its substrate, glucose, be dissolved in an aqueous medium. Accordingly, in order for the enzyme to be useful in oxygen scavenging processes, it has been necessary to introduce large quantities of moisture into the container. Quite often though, these large quantities of moisture have adverse effects upon the food products within the container. The moisture can lead to the growth of fungi which in turn can cause the food to spoil. It can also lead to the loss of desirable characteristics such as the crispness of the food, etc.

Thus, a process which would allow the removal of oxygen from the atmosphere of an enclosed container with the use of dry enzymes would be a significant contribution to the art.

It is an object of the present invention to provide an improved process for removing oxygen from the interior of an enclosed container. It is yet a further object of the present invention to provide articles of manufacture which possess dry, oxygen free interiors.

Other aspects, objects, and advantages of this invention will become apparent to one skilled in the art upon consideration of the accompanying disclosure.

DETAILED DESCRIPTION OF THE INVENTION

In accordance with the present invention, a process has been discovered for the removal of residual oxygen from the interior of an enclosed container utilizing a scavenging system which comprises a gaseous alcohol introduced together with dried whole cells, broken cells or cell extracts which contain an alcohol oxidase enzyme present into the interior of the container.

As used in this application, the term "dried" refers to a composition of whole cells, broken cells or cell extracts containing alcohol oxidase and having from about 10 to about 30 weight percent water. The composition can contain whole cells as well as other cellular components of lysed cells such as proteins, lipids, carbohydrates, etc. It is important to note that despite the moisture content of the composition, that it is still dry to the touch.

The alcohol oxidase utilized for the practice of this invention may be derived from methylotrophic yeast or fungi. It is desired for this invention that the alcohol oxidase utilized be capable of catalysing the reaction between oxygen and at least one suitable alcohol substrate in a dried state in either whole cells, broken cells or cell extracts.

Suitable methylotrophic yeasts which may be used for the practice of the present invention include but are not limited to *Pichia pastoris*.

A process for fermenting *Pichia pastoris* so that it produce high levels of the enzyme, alcohol oxidase, is disclosed in U.S. Pat. No. 4,430,427 by Thomas R. Hopkins, which is assigned to Phillips Petroleum Company and incorporated herein by reference.

*Pichia pastoris* produced in the manner disclosed in Hopkins patent contain up to 20 weight percent of their total protein content as alcohol oxidase. For example *Pichia pastoris* cultured according to the Hopkins patent generally contain from about 10 to about 20 weight percent alcohol oxidase.

Due to the high level of alcohol oxidase contained within these microorganisms, it is not necessary to extract the enzyme from the cell bodies of these microorganisms in order to have an effective oxygen scavenger. Rather, whole cell preparations of these microorganisms can be introduced directly into the container with alcohol vapor and the alcohol oxidase within the interior of these cells will clear the container of residual oxygen present. In the practice of the present invention the microorganisms may be either living or dead. Another advantage of the present invention is that it does not require the costly and difficult separation and purification steps that are often associated with the industrial application of enzymes.

Similarly, crude alcohol oxidase extracts dried after removal of broken cell solids by filtration or centrifugation may also be used in the present invention.

Although less preferred due to the higher processing costs, dried suspensions and gels of ruptured yeast or fungi cells will also function as an effective oxygen scavenger in the present invention. It is immaterial to the practice of the present invention whether the suspension or gel is pure alcohol oxidase, or whether it still contains cell debris.

Pure dried (contain from at least 10 weight percent water to 30 weight percent) crystalline alcohol oxidase can be introduced into the container and will also function as an effective oxygen scavenger. A method for extracting alcohol oxidase from Pichia cells is disclosed in U.S. Pat. No. 4,540,668.

It is presently preferred in one embodiment of the invention to utilize dried whole cell preparations of yeast or fungi cells, broken cells or cell extracts containing alcohol oxidase rather than pure dried crystalline alcohol oxidase in the process of the present invention.

It has been discovered that the optimal enzymatic activity of these dried whole cell preparations occurs when they contain from about 10 to 30 weight percent of water. Preferably, cells used for the practice of this invention will contain from about 13.8 to about 25 weight percent water.

It has also been noted that the weight of whole cells, broken cells or cell extract containing alcohol oxidase required to achieve a substantial removal of oxygen is related to the amount of moisture present. For example to achieve effective oxygen removal at 10.6 weight percent moisture (see Example II), 1-2 grams of active dried *Pichia pastoris* were required, whereas at 13.8 weight percent moisture only one fourth of a gram was required.

Despite the level of hydration, the cells for the practice of the present invention are preferred to be present in a dry (to the touch) pourable granulated flaked or powdered form. Suitable methods for producing granulated, flaked or powdered dry pourable whole cells, broken cells or cell extracts are known in the art. The pourable granules, flaked or powder may be formed during the drying process or by, grinding or milling dried cells, broken cells or cell extracts.

Drying whole cells, broken cells or cell extracts may be accomplished by any means known in the art which does not inactivate the alcohol oxidase enzyme present in the cells. Granulated, flaked or powdered cells are most preferably formed by fluidized bed drying, which is particularly suited for the practice of this invention. One example of a suitable drying technique would be to concentrate the cells (greater than 300 grams cells/liter), extrude the concentrate through mesh screen and dry the cells in a fluidized bed dryer. Other techniques such as spray drying, freeze drying or vacuum drying may also be used. Additionally, drying with acetone, isopropyl alcohol or other water miscible solvents may also be used.

It is possible to partially rehydrate the dried cells by placing the cells in an environment containing a source of moisture. Generally rehydration may be accomplished by placing the dried cells in a sealed warm (35° C.-55° C.) humid chamber for about 4 to about 24 hours.

The dried whole cells, broken cells or cell extracts can be placed directly into the container from which oxygen is to be removed or they can be encapsulated with a gas permeable membrane constructed from fibers, paper, or any other material conventionally used within the packaging industry. If the alcohol substrate is to be provided from without the encapsulation membrane, the membrane will also need to be alcohol permeable. If desired, a substances such as deodorants, absorbants, supports or desiccants can be admixed with the alcohol oxidase containing preparation. The quantity of such substances added is not material to the practice of the present invention.

It is presently preferred that there be about 0.25 to about 2 grams of cells for every 20 cm$^3$ of atmospheric volume contained within the container. As used in this application, the term "atmospheric volume" refers to the area of the container or package which is not filled by the contents of the container.

In addition to introducing the enzyme into the package, it is also preferred to flush the package or container with an inert gas such as nitrogen or any other inert gas used in the packaging industry prior to sealing. This flushing can be accomplished by any means which is conventionally used within the industry such as packaging under a pure nitrogen atmosphere.

Flushing the container with an inert gas evacuates most of the oxygen from the container, so that the dried alcohol oxidase serves only to scavenge the residual oxygen. This reduces the quantity of dried enzyme which has to be introduced into the container.

The flushing step may also have a second function. It may be used to introduce alcohol oxidase's substrate, alcohol, into the container as a gaseous vapor. This can be accomplished by bubbling the inert gas through an alcoholic solution. The use of a gaseous substrate serves to further reduce the quantity of moisture that is introduced into the container.

The substrate utilized in the present invention is dependent upon the alcohol oxidase used. Alcohol oxidase enzymes generally function only with a limited number of substrates. It is, therefore, recognized that a suitable substrate will have to be selected for the alcohol oxidase employed in this invention. Thus, as an example, if the alcohol oxidase derived from *Pichia pastoris* is utilized as the alcohol oxidase in the scavenging system the, suitable alcohol substrates would include alcohols selected from the group consisting of methanol, ethanol, propanol and butanol. The preferred alcohol substrate for the practice of this invention with edible food is currently ethanol.

These alcohols are preferably introduced into the container as a vapor either alone or in combination with the flush of inert gas. The alcohol should be added in an amount in the range of about 0.1 $\mu$mole/ml to about 1.5 $\mu$mole/ml alcohol, to the total atmospheric volume preferably about 0.3 $\mu$moles/ml alcohol to the total atmosphere. Such a system is not possible using non-volatile substrates such as glucose.

In a less preferred embodiment of the invention the alcohol can be introduced as a liquid into the container. When so added the alcohol should be present in an amount about the range of about 0.075 to about 0.15 grams of alcohol per liter of atmospheric volume scavenged.

The following specific examples are intended to illustrate the advantages of the process of this invention, but are not intended to unduly limit this invention.

EXAMPLE I

*Pichia pastoris* was fermented in the manner disclosed in U.S. Pat. No. 4,540,668. The resulting cells were processed into a dried fine powder in the following manner. First, the cells were separated from the fermentation broth by centrifugation. Next, the supernatant was placed within a filter press to further remove liquid, resulting in the production of a yeast cake. Finally, the yeast cake was extruded through a nozzle to produce thick strands with a rectangular cross-section. These strands were then ground into a powder sufficiently fine to pass through a 10 mesh screen, (openings per square inch).

The powdered *Pichia pastoris* cells produced in this process had a water content of from 10 to 11 weight percent. In order to increase the water content of this *Pichia pastoris* powder, it was sealed in an airtight chamber along with an open container of warm water (50° C.). The *Pichia pastoris* powder which remained in this chamber for 24 hours had a water content of 25 weight percent.

EXAMPLE II

The purpose of this example is to demonstrate that powdered yeast cells containing from about 10 to about 20 wt. percent of their total protein content as levels of alcohol oxidase, are effective oxygen scavengers when they are introduced into an enclosed container along with the enzyme substrate, alcohol.

Varying quantities of the powdered *Pichia pastoris* produced in Example I, along with varying quantities of activated charcoal as noted were enclosed within air permeable membranes constructed from paper fibers. These packets were sealed in 20 cm³ Diels Alder tubes under atmospheric conditions and 0.05 cm³ of 99 percent ethanol was injected into each tube. Head space oxygen analysis was done by gas chromatography after 13 days at room temperature. The following results were obtained.

TABLE 1

| Sample | g Pichia: g Carbon | Hours Hydration | Moisture[1] Content Wt % | Mole % $O_2$ | $O_2$ Capacity[2] μg/g Pichia | % $O_2$[3] Removed |
|---|---|---|---|---|---|---|
| A | 1:0 | 0 | 10 | 19.0 | 25.9 | 13.2 |
|   |     | 4 | 14 | 13.9 | 71.4 | 36.5 |
|   |     | 24 | 25 | 2.8 | 170.5 | 87.2 |
| B | 2:0 | 0 | 10 | 17.6 | 19.2 | 19.6 |
|   |     | 4 | 14 | 8.7 | 58.9 | 60.3 |
|   |     | 24 | 25 | 1.5 | 91.1 | 93.2 |
| C | 3:0 | 0 | 10 | 15.9 | 17.9 | 27.4 |
|   |     | 4 | 14 | 3.7 | 54.2 | 83.1 |
|   |     | 24 | 25 | 1.5 | 60.7 | 93.2 |
| D | 1:1 | 0 | 10 | 17.7 | 37.5 | 19.2 |
|   |     | 4 | 14 | 11.4 | 93.8 | 47.9 |
|   |     | 24 | 25 | 1.4 | 183.0 | 93.6 |
| E | 3:1 | 0 | 10 | 15.7 | 18.5 | 28.3 |
|   |     | 4 | 14 | 5.0 | 50.3 | 77.2 |
|   |     | 24 | 25 | 1.4 | 61.0 | 93.6 |
| F | 1:0.5 | 0 | 10 | 18.1 | 33.9 | 17.4 |
|   |     | 4 | 14 | 12.6 | 83.0 | 42.5 |
|   |     | 24 | 25 | 1.3 | 183.9 | 94.1 |
| G | 3:0.5 | 0 | 10 | 13.7 | 24.4 | 37.4 |
|   |     | 4 | 14 | — | — | — |
|   |     | 24 | 25 | 1.4 | 61.0 | 93.6 |
| H | 2:0.2 | 0 | 10 | 16.2 | 25.4 | 26.0 |
|   |     | 4 | 14 | 3.6 | 81.7 | 83.6 |
|   |     | 24 | 25 | 1.4 | 91.5 | 93.6 |
| I | 1:0.2 | 0 | 10 | 18.8 | 27.7 | 14.2 |
|   |     | 4 | 14 | 6.9 | 133.9 | 68.5 |
|   |     | 24 | 25 | 1.3 | 183.9 | 94.1 |

[1]Moisture content for the gravimetric determination of weight percent moisture. a 5 gram sample was first weighted in a forced draft oven at 100° C. for 16 hours. Placed in a desicator and reweighted when cool.
[2]Oxygen capacity was expressed in micromoles of oxygen removed per gram of test material.
[3]Oxygen removed was calculated from initial and final $O_2$ concentrations determined by gas chromatograph at 760 mm and 25° C.

The above data shows that powdered yeasts containing alcohol oxidase will function as an effective oxygen scavenger. The effectiveness increases if the powder has a moisture content within the range of about 14 to about 25 weight percent.

EXAMPLE III

The purpose of this example is to show:

1) that when the enzyme's substrate, alcohol, is introduced into the container in the form of a gas, the AO present within the powdered *Pichia pastoris* cells function as an effective oxygen scavenger; and 2) that flushing the container with an inert gas will increases the effectiveness of the present invention.

Powdered *Pichia pastoris* cells were produced and hydrated in the manner disclosed in Example I.

Various quantities of the powdered *Pichia pastoris* cells having an AO of approximately from 10 to 20 percent of the total cell proteins were sealed in 20 ml Diels Alder tubes.

These tubes were then flushed with 150 ml of gaseous nitrogen containing 0.73 w/v percent ethanol which was formed by bubbling nitrogen gas through a 99 percent solution of ethanol.

The nitrogen gas also contained 1.59 w/v percent of oxygen. Oxygen was incorporated into the inert gas in order to simulate the conditions that an oxygen scavenger would be confronted with in the food packaging industry.

The sealed and flush tubes were stored for 14 days at room temperature. Their oxygen content was determined via gas chromatography. The following results were obtained.

TABLE 2

Removal of Oxygen with Active Dried *Pichia pastoris*

| Wt. % Moisture | [b]Wt. Active Dried Pichia, g | % Oxygen Removed | μmMoles $O_2$ Removed | Final Oxygen Concentration |
|---|---|---|---|---|
| 10.6[a] | 2.0 | 80 | 1.28 | .31 |
|   | 1.0 | 53 | .84 | .75 |
|   | .5 | 26 | .41 | 1.28 |
|   | .25 | 14 | .23 | 1.37 |
| 13.8 | 2.0 | 98 | 1.51 | .03 |
|   | 1.0 | 99 | 1.57 | .02 |
|   | .5 | 77 | 1.22 | .38 |
|   | .25 | 94 | 1.50 | .09 |
| 15.9 | 2.0 | 94 | 1.50 | .09 |
|   | 1.0 | 94 | 1.50 | .09 |
|   | .5 | 95 | 1.51 | .08 |
|   | .25 | 82 | 1.31 | .29 |
| 22.6 | 2.0 | 100 | 1.59 | .00 |
|   | 1.0 | 95 | 1.51 | .09 |
|   | .5 | 96 | 1.53 | .06 |
|   | .25 | 97 | 1.54 | .06 |

[a]Active dried *Pichia astoris*, no additional hydration, active refers to the fact the cells are still living after being dried.
[b]Dried Wt., refers to the weight after drying as described in footnote 1, Table 1.

The above data shows that alcohol oxidase will function as an effective oxygen scavenger when its substrate, alcohol, is introduced into the container in its gaseous state. Further, the effectiveness of the present process can be increased by purging the container with an inert gas as compared with the results of Example II.

Reasonable variations and modifications can be made or followed, in view of the foregoing, without departing from the spirit and scope of this invention.

That which is claimed is:

1. An oxygen-free enclosed container comprising an enclosed dry container containing therein
   a) a dry food product; and
   b) an oxygen scavenger composite of
      i) a dried alcohol oxidase containing agent selected from the group consisting of whole cells, broken cells and cell extracts of alcohol oxidase containing *Pichia pastoris* cells having a moisture content in the range of about 10 to about 30 weight percent; and
      ii) at least one substrate selected from the group consisting of methanol, ethanol, propanol, or butanol wherein said container is purged with an inert gas either prior to, contemporaneously with, or after the introduction of said alcohol oxidase into the container, and said alcohol oxidase containing agent and said suitable substrate are present in an amount sufficient to effect the substantial elimination of said oxygen gas from the gas phase of the closed container wherein said alcohol substrate is introduced into said container as a gas in admixture with said inert gas and said alcohol is present within the range of 0.1 to 1.5 μmoles/ml of the total atmosphere in said container.

2. The oxygen-free enclosed container of claim 1 wherein said alcohol oxidase is present within an air permeable membrane.

3. The oxygen-free enclosed container of claim 1, wherein there is from 1 gm to 10 gm of said cells for every 80 cm$^3$ of atmospheric volume within said container.

4. The oxygen-free enclosed container of claim 1 wherein said alcohol oxidase is present in whole cells.

5. The oxygen-free enclosed container of claim 4 wherein said cells are present as a pourable granules, flakes or powder capable of passing through a 10 mesh screen and having a water content of from 14 to 25 weight percent.

6. The oxygen-free enclosed container of claim 1 wherein the alcohol substrate is ethanol.

* * * * *